(12) United States Patent
Faley et al.

(10) Patent No.: US 9,476,950 B2
(45) Date of Patent: Oct. 25, 2016

(54) MEASURING INSTRUMENT, ELECTRICAL RESISTANCE ELEMENTS AND MEASURING SYSTEM FOR MEASURING TIME-VARIABLE MAGNETIC FIELDS OR FIELD GRADIENTS

(75) Inventors: Mikhail Faley, Juelich (DE); Ulrich Poppe, Dueren (DE); Robert L. Fagaly, San Diego, CA (US)

(73) Assignee: Forschungszentrum Juelich GmbH, Juelich (DE)

( * ) Notice: Subject to any disclaimer, the term of this patent is extended or adjusted under 35 U.S.C. 154(b) by 1261 days.

(21) Appl. No.: 13/261,077

(22) PCT Filed: May 18, 2010

(86) PCT No.: PCT/DE2010/000561
§ 371 (c)(1),
(2), (4) Date: Dec. 12, 2011

(87) PCT Pub. No.: WO2010/145631
PCT Pub. Date: Dec. 23, 2010

(65) Prior Publication Data
US 2012/0088674 A1    Apr. 12, 2012

(30) Foreign Application Priority Data
Jun. 20, 2009   (DE) .................. 10 2009 025 716

(51) Int. Cl.
*G01F 23/24*   (2006.01)
*G01R 33/035*  (2006.01)
(Continued)

(52) U.S. Cl.
CPC ............. *G01R 33/035* (2013.01); *H01C 7/00* (2013.01); *H01L 39/02* (2013.01)

(58) Field of Classification Search
CPC ........ G01R 33/035; H01L 39/02; H01C 7/00
USPC ....................................................... 505/160
See application file for complete search history.

(56) References Cited

U.S. PATENT DOCUMENTS 5,283,523 A   2/1994  Uhl et al.
5,548,262 A   8/1996  Kugai et al.
(Continued)

FOREIGN PATENT DOCUMENTS

CN    1455934       11/2003
DE    296 20 718    3/1997
(Continued)

OTHER PUBLICATIONS

He D F et al: "N-14 NQR using a high-Tc rf SQUID with a normal metal transformer" Superconductor Science and Technology, IOP Publishing, Techno House, Bristol, GB, vol. 21, No. 1, Jan. 1, 2008, p. 15023, XP020128582 ISSN: 0953-2048 the whole document.
(Continued)

*Primary Examiner* — Paul Wartalowicz
(74) *Attorney, Agent, or Firm* — Jordan and Koda, PLLC (57) ABSTRACT

The invention relates to a measuring instrument for time-variable magnetix fluxes, or flux gradients, to electrical resistance elements, and to a measuring system comprising a measuring instrument or electrical resistance element according to the invention. The core component of the measuring instrument is a flux transformer composed of a base material which has a phase transition to the superconducting state. According to the invention, even when the base material is in the superconducting state, this flux transformer comprises at least one load region having electrical resistance that is other than zero for dissipating the electric energy in the conductor loop thereof. For this purpose, according to the invention the conductor loop and the magnetic field source are disposed in one plane and are typically photolithographically structured. The resistance elements according to the invention, having resistance values of $\leq 10^{-4}\Omega$, are used as core components in the measuring instrument. According to the invention, measurement is possible in a broader frequency range, with less noise and with greater sensitivity than was possible with generic measuring instruments or measuring systems.

39 Claims, 10 Drawing Sheets (51) Int. Cl.
*H01L 39/02* (2006.01)
*H01C 7/00* (2006.01)

(56) References Cited

U.S. PATENT DOCUMENTS

| | | | |
|---|---|---|---|
| 6,300,760 | B1 | 10/2001 | Schubert et al. |
| 2006/0147154 | A1* | 7/2006 | Thom et al. ............... 385/37 |
| 2006/0279172 | A1* | 12/2006 | Ito et al. ............... 310/328 |
| 2007/0194225 | A1 | 8/2007 | Zorn |

FOREIGN PATENT DOCUMENTS

| | | |
|---|---|---|
| DE | 196 11 900 | 10/1997 |
| DE | 198 39 935 | 2/2000 |
| DE | 695 30 811 | 3/2004 |
| DE | 103 52 856 | 6/2005 |
| EP | 0 675 370 | 3/1995 |
| EP | 0 926 508 | 11/1998 |
| EP | 1 353 339 | 10/2003 |
| JP | 62-34084 | 2/1987 |
| JP | 63-223582 | 9/1988 |
| JP | 6-66905 | 3/1994 |
| JP | 6-97521 | 4/1994 |
| JP | 7-318625 | 12/1995 |
| JP | 11-186623 | 7/1999 |
| WO | WO-98/23969 | 6/1998 |

OTHER PUBLICATIONS

"Handbook of Chemistry & Physics Online" Jan. 1, 2010, CRC, XP002602600 vol. 91, pp. 12-72-pp. 12-73; table 3.
Dyvorne, H.; u.a.: Flux transformers made of commercial critical temperature superconducting wires. In: Review of scientific instruments 79, 025107, 2008.
Yang, T., Q.; u.a.: Magnetometer utilizing SQUID pico-voltmeter and cooled normal pickup coil. In: Physica C 426-431, 2005, S. 1596-1600.
Ishimaru, Y.; u.a.: Improved fabrication process for monolithic integrated high-Tc dc superconducting quantum interference device. In: Japanese journal of applied physics, vol. 46, No. 28, 2007, pp. L699-L702.
Lusher, C. P.L u.a.: Current sensing noise thermometry using a low Tc DC SQUID preamplifier. In: Meas, Sci. Technol. 12, 2001, Seiten 1-15.
(J. E. Zimmermann, N. V. Frederick, "Miniature Ultrasensitive Superconducting Magnetic Gradiometer and Its Use in Cardiography and Other Applications", Appl. Phys. Lett. 19, 16 (1971)).
Hiroyuki Ohsake et al.: "Characteristics of Resistive Fault Current Limiting Elements Using YBCO Superconducting Thin Film with Meander-Shaped Metal Layer", IEEE Transactions on Applied Superconductivity, IEEE Service Center, Los Alamitos, CA, US, Bd. 19, Nr. 3, Jun. 1, 2009, Seiten 1818-1822, XP011262003, ISSN: 1051-8223.
Hori et al.: "Study of kV Class Current Limiting Unit with YBCO Thin Filsm", IEEE Transactions on Applied Superconductivity, IEEE Service Center, Los Alamitos, CA, US, Bd. 17, Nr. 2, Jun. 1, 2007, Seiten 1986-1989, XP011188247, ISSN: 1051-8223, DOI: DOI:10.1109/tasc.2007.898449.
Hiroyuki Ohsake et al: "Characteristics of Resistive Paitit Current Limiting Elements Using YBCO Superconducting Thin Film with Meander-Shaped Metal Layer", IEEE Transactions on Applied Superconductivity, IEEE Service Center, Los Alamitos, CA, US, vol. 19, No. 3, Jun. 5, 2009 (Jun. 5, 2009), pp. 1818-1822, XP011262003, ISSN:1051-8223.
Hori et al,: "Study of kV Class Current Limiting Unit with YBCO Thin Film", IEEE Transactions on Applied Superconductivity, IEEE Service Center, Los Alamitos, CA, US, vol. 17, No. 2, Jun. 30, 2007 (Jun. 30, 2007), pp. 1986-1989, XP011188247, ISSN: 1051.8223, DOI: DOI:10,1109/tasc.2007.898449.
Chinese Office Action dated Nov. 27, 2013.
Second Chinese Office Action dated Jul. 3, 2014.
Third Chinese Office Action dated Mar. 30, 2015.
Chinese Communications dated Feb. 21, 2014

\* cited by examiner

MEASURING INSTRUMENT, ELECTRICAL RESISTANCE ELEMENTS AND MEASURING SYSTEM FOR MEASURING TIME-VARIABLE MAGNETIC FIELDS OR FIELD GRADIENTS

BACKGROUND OF THE INVENTION

The invention relates to a measuring instrument for time-variable magnetic fields or field gradients, to electrical resistance elements, which can be used as core components in the measuring instrument, and to a measuring system comprising a measuring instrument or an electrical resistance element according to the invention.

Superconducting quantum interference devices (SQUIDs) are at present the most sensitive sensors for magnetic fields. The dynamic range thereof, however, is limited. If the measuring site is permeated not only by the time-variable magnetic field to be measured, but also by an interference field, which is static and greater by several orders of magnitude, or which can be varied only slowly, the sensor is often saturated by the interference field alone. The measurement signal itself is only a very small modulation in a high background signal caused by the interference field.

Flux transformers are employed so as to separate the measurement signal from the background signal. Using a pick-up coil, these convert the time-variable component of the magnetic flux generated by the field to be measured in this pick-up coil into electric current. This current feeds a magnetic field source, which typically is a coil (input coupling coil), which thereupon generates an auxiliary magnetic field. This auxiliary field is measured by the sensor itself, which is typically a SQUID.

To this end, superconducting flux transformers are typically employed for the most sensitive measurements at low frequencies so as to minimize signal losses (J. E. Zimmermann, N. V. Frederick, "Miniature Ultrasensitive Superconducting Magnetic Gradiometer and Its Use in Cardiography and Other Applications", Appl. Phys. Lett. 19, 16 (1971)). The disadvantage is that successive interference components, which are due to highly static as well as very slowly variable (time constant>10 min) magnetic interference fields, accumulate in the circuit composed of the pick-up coil and magnetic field source. This progressively worsens the dynamic range and sensitivity of the measuring system.

Normally conducting flux transformers are known, for example, from (T. Q. Yang, Kenichiro Yao, Daisuke Yamaski, Keiji Enpuku, "Magnetometer utilizing SQUID picovoltmeter and cooled normal pickup coil", Physica C 426-431, 1596-1600 (2005)) and (D. F. He, H. Itozaki, M. Tachiki, "Improving the sensitivity of a high-$T_c$ SQUID at MHz frequency using a normal metal transformer", Superconductor Science and Technology 19, pp. 231-234 (2006)). The disadvantage is that, at approximately 10 μs, the relaxation time constants of these flux transformers are too short, so that high losses occur at low frequencies below approximately 100 kHz and the achievable measurement results are no longer meaningful. At the same time, they introduce tremendous noise into the measurement signal in this frequency range.

A flux transformer is known from (H. Dyvorne, J. Scola, C. Fermon, J. F. Jacquinot, M. Pannetier-Lecoeur, "Flux transformers made of commercial high critical temperature superconducting wires", Review of Scientific Instruments 79, 025107 (2008)), the pick-up coil and input coupling coil of which are each made of tape-shaped wires and which are connected to each other by a tape-shaped double-circuit line. The normally conducting soldering points between the coils and the double-circuit line dissipate the interference components accumulating in superconducting coils. The disadvantage is that the sensitivity of this array is insufficient, notably for biomagnetic and geomagnetic measurements.

SUMMARY OF THE INVENTION

It is therefore the object of the invention to provide a measuring instrument and a method, by which time-variable magnetic fields, or field gradients, can be measured at low and high frequencies, at a time constant that can be selected within a broader range and with greater sensitivity, yet less noise, as compared to the prior art.

These objects are achieved according to the invention by a measuring instrument according to the main claim, by electrical resistance elements, which can be used as core components in the measuring instrument, according to the additional independent claims, and by a measuring system according to a further independent claim. Further advantageous embodiments will be apparent from the dependent claims.

As part of the invention, a measuring instrument for time-variable magnetic fields, or field gradients, was developed. This measuring instrument comprises a flux transformer. The flux transformer contains a conductor loop ("pick-up coil") comprising a base material, which has a phase transition to the superconducting state, for converting a time-variable magnetic flux, or flux gradient, into an electric current, and a magnetic field source that is fed by this conductor loop for converting the electric current into an auxiliary magnetic field. The material of the magnetic field source advantageously likewise has a phase transition to the superconducting state. The time-variable magnetic flux, or flux gradient, is advantageously generated solely by the time-variable component of the magnetic field, or magnetic field gradient, to be measured. The measuring instrument comprises a sensor such as a SQUID for the auxiliary magnetic field.

Even when the base material is in the superconducting state, the flux transformer comprises at least one resistive region (also referred to as a "load region") having electrical resistance that is other than zero for dissipating the electric energy in the circuit, which comprises the conductor loop and the magnetic field source. The load region may also comprise the conductor loop, the magnetic field source, or portions of the conductor loop or magnetic field source. This embodiment is advantageous, for example, when the conductor loop or the magnetic field source is a type II superconductor and is operated in the respective application in the superconducting state, yet above the first critical magnetic field thereof, or above the first critical current thereof. The superconducting material is then permeated by Abrikosov vortices. If these are mobile, energy is required for this movement associated with friction, with this energy acting as resistance that is other than zero. The load region, however, is generally different from the conductor loop and the magnetic field source. The load region is then composed of non-superconducting material and is integrated, for example serially, into the circuit comprising the conductor loop and magnetic field source.

According to the invention, the conductor loop and the magnetic field source are disposed in one plane. To this end, the conductor loop and/or the magnetic field source can be designed, in particular, as planar structures of thin films having a layer thickness of approximately 1 μm or less. It is advantageous for the conductor loop and/or the magnetic field source to be designed as epitaxial superconducting layers on monocrystalline substrates, especially when the base material of the conductor loop and/or the material of the magnetic field source is a high-temperature superconductor. Such layers can be structured by way of photolithography, for example. One embodiment of the conductor loop and/or the magnetic field source in the manner of a thin film structure advantageously improves the sensitivity of the measuring instrument and reduces noise.

The superconducting wires and tapes employed by Dyvorne et al. are very difficult to convert from thin films into planar structures.

The arrangement in one plane shall not be understood to be limiting in such a way that the conductor loop and the magnetic field source must be disposed on the same substrate. The conductor loop and the magnetic field source can be structured on separated substrates, for example, which are joined and electrically connected by the structured surfaces thereof ("flip-chip" technology). To this end, a normally conducting layer may be disposed, in particular, on one substrate, or on both substrates. The intermediate layer formed as a result between the two substrates when joining the substrates can advantageously function as the load region between the conductor loop and the magnetic field source, notably when both the conductor loop and the magnetic field source are produced from high-temperature superconducting materials. This advantageously overcomes the difficulties that usually occur upon contact between ceramic high-temperature superconductors and normally conducting metals. If, in contrast, the conductor loop and the magnetic field source are composed of low-temperature superconducting materials, it is more advantageous for the electrical connection between the two substrates to be superconducting and for the load region to be implemented on one of the substrates, or on both substrates. This type of manufacture can be better controlled and reproduced in terms of the technology than the introduction of a normally conducting intermediate layer between the two substrates.

By combining the superconducting conductor loop with the non-superconducting load region, very low resistance values can be achieved in the circuit, which comprises the conductor loop and the magnetic field source. The ohmic resistance value can be tailored to approach zero so closely that energy is just barely dissipated from the circuit at a relaxation time that is relevant for the respective application. This process was observed in Dyvorne of al. However, the sensitivity of the array disclosed by Dyvorne et al. was insufficient, notably for biomagnetic and geomagnetic measurements, because only a fraction of the magnetic flux that permeated the pick-up coil was transferred to the input coupling coil (see FIG. 3 in Dyvorne et al. with related description). It has now been found that the arrangement according to the invention of the conductor loop and magnetic field source in one plane can advantageously reduce the losses of magnetic flux on the path from the conductor loop to the magnetic field source. With this geometry, the line length between the conductor loop and the magnetic field source can advantageously be minimized. In addition, this line can be designed so as to minimize the inductance per unit length thereof. For example, the forward and return conductors between the conductor loop and magnetic field source can be structured so closely next to each other that these lines enclose only a very small surface area between them. The forward and return conductors can notably be stacked on top of each other, whereby they are separated by a thin insulating film.

It has been found that the total inductance of the line between the conductor loop and magnetic field source can thus be minimized. This inductance is decisive for the parasitic magnetic flux that the line between the conductor loop and magnetic field source generates when the current passes through from the conductor loop to the magnetic field source itself. The greater this parasitic flux is, the lower the auxiliary field that is generated by the magnetic field source and can be detected by the sensor.

The conductor loop can notably be a coil made of a wire or a thin film having one or more windings. This embodiment is also referred to hereinafter as a pick-up coil. The magnetic field source can notably be a coil made of a wire or a thin film having one or more windings. This embodiment is also referred to hereinafter as an input coupling coil. The pick-up coil and/or the input coupling coil advantageously have a plurality of windings. This increases the respective inductance, and hence the ratio between the field, or field gradient, to be measured and the electric current in the pick-up coil.

The pick-up coil advantageously has a diameter of 1 cm or more, preferably of 3 cm or more, and still more preferably of 5 cm or more. Especially in conjunction with a further advantageous embodiment, in which the input coupling coil has a diameter of 3 mm or less, the effect of such a size is that the flux effected by the magnetic field, or magnetic field gradient, which is to be measured, is concentrated in terms of the surface area, during the transfer from the pick-up coil to the input coupling coil, whereby the magnetic field at the sensor is amplified. The sensor can more reliably distinguish a magnetic field thus amplified from external interference fields, which improves the accuracy of the measurement. Examples of such interference fields are the Earth's magnetic field and magnetic fields that originate from current-conducting lines. In the interest of a large amplification of the field, it is generally advantageous for the ratio of the diameters of the input coupling coil and pick-up coil to be no more than 0.1. This was not achieved in Dyvorne et al.

A diameter of the input coil of 3 mm or less results in improved magnetic field amplification by the flux transformer and improved coupling to the sensor, because this corresponds to the maximum size of the sensitive zone of customary sensitive magnetic field sensors. The sensitive zone is deliberately kept small in these sensors so as to minimize residual noise (notably with SQUIDs) and interference. Moreover, a small sensitive zone can be shielded disproportionately better against external magnetic fields than a larger sensitive zone. In addition, the smaller the sensitive zone is, the less an interference field that is distributed over a large area, such as the Earth's magnetic field, contributes to the measurement signal. In the interest of high amplification, diameters of the input coupling coil down to 100 µm may be advantageous. This is possible primarily with photolithographically structured multi-layer input coupling coils that have a large number of windings which are made of thin films on a planar substrate.

The input coupling coil advantageously has between 80% and 120% of the inductance of the pick-up coil, and more particularly the same inductance as the pick-up coil. This is when the magnetic flux that is generated by the magnetic field, or magnetic field gradient, to be measured in the pick-up coil is converted most efficiently into a magnetic field originating from the input coupling coil. If the input coupling coil and pick-up coil have differing diameters, the winding numbers must be adjusted accordingly to achieve the same inductances. The inductance of a coil is approximately linear to the diameter thereof and quadratic in the number of windings thereof. The ratio of the numbers of windings between the input coupling coil and pick-up coil is thus advantageously at least as large as the square root of the ratio of the diameters of the input coil and pick-up coil (hereinafter referred to as q). If the ratio of the numbers of windings is exactly equal to q, the magnetic field at the sensor is maximally amplified as compared to the field in the pick-up coil. Amplification factors of approximately 100 can thus be achieved.

The tape-shaped superconductors used by Dyvorne et al. cannot achieve an input coupling coil diameter of 3 mm or less because these superconductors lose the superconductivity thereof when they are bent in radii of less than 5 mm ("Experimental" section in Dyvorne et al.).

In a particularly advantageous embodiment of the invention, the magnetic field source is disposed at least partially inside the region that is enclosed by the conductor loop. A particularly short length of the line between the conductor loop and magnetic field source can be implemented in such an arrangement. Ideally, the magnetic field source can be integrated in the conductor loop so that, with the exception of the existing conductor loop, no additional feed line is required for the magnetic field source.

The time constant can advantageously be selected in a wide range from approximately 1 ms to approximately $10^6$ s. To this end, the electrical resistance of the load region advantageously ranges between $10^{-11} \Omega$ and $10^{-5} \Omega$, and preferably between $10^{-11} \Omega$ and $10^{-6} \Omega$.

Resistance of roughly 1Ω, as is typical of normally conducting flux transformers, worsened the measurement accuracy due to the thermal noise (Nyquist noise) thereof alone. At frequencies below 1 kHz, it was ultimately only possible to conduct the magnetic field measurement at noise of at least 10 pT/Hz$^{1/2}$, so that biomagnetic or geomagnetic measurements, for example, were possible only with severe limitations. In addition, the relaxation time for the circulating current, which is derived as the quotient from the total inductance and the total resistance of the circuit, was below 10 μs for typical inductances between 10 nH and 100 μH. This was too short for many applications.

If the flux transformer, in contrast, was completely superconducting, having a resistance of basically 0Ω up to an accuracy of approximately $10^{-20} \Omega$, no energy whatsoever was dissipated in it in this state. Any change in interfering external magnetic fields, or magnetic field gradients, however slow this change may have been, was thus accumulated in the form of electric energy. This energy was not fully dissipated in the flux transformer until the superconducting material was heated to above the transition temperature thereof. The energy was generally dissipated only partially if the critical current of the superconducting material was briefly exceeded. When geomagnetic magnetic field measurements, for example, were carried out, such as from a helicopter, and this helicopter changed its orientation with respect to the Earth's magnetic field when turning, the flux transformer was generally not ready for measurements until it had heated up and cooled down again.

The measuring instrument according to the invention eliminates both disadvantages, without requiring a trade-off in terms of a loss of sensitivity. The low-noise resistors used in this measuring instrument having very small resistance values, but are not zero, can be employed not only for flux transformers and sensors, but also for several other structures in superconducting electronics, such as RSFQ or quantum computers.

The inductance L of the flux transformer is composed of the sum of inductances of the pick-up coil, input coupling coil and all connections. In total, the flux transformer advantageously has an inductance L between 1 nH and 1 mH, and preferably between 10 nH and 100 μH. Inductance in this range is particularly suited to implement another particularly advantageous embodiment of the invention. In this further particularly advantageous embodiment, an electric current circulating in the flux transformer has a relaxation time τ between 1 ms and $10^6$ s, and preferably between 3 ms and 300 s, when the base material is in the superconducting state. As a result of such an available selection of relaxation times, the measuring instrument according to the invention can be used to measure both fast phenomena on a frequency scale around 1 MHz and magnetic fields, and magnetic field gradients, changing at frequencies of roughly $1/(2\pi\tau)$. For a meaningful measurement, it is necessary to be able to capture a minimum number of oscillations within the relaxation time. It is particularly important for the sensitivity of the measuring system that the Nyquist noise of the load region drops significantly at frequencies above $1/(2\pi\tau)$.

The flux transformer is effectively an RL circuit for the time-variable signals. In this RL circuit, R is the electrical resistance of the load region and L is the inductance of the flux transformer. The total resistance of the RL circuit is a crucial parameter for the time constant τ of this RL circuit. The lower the resistance R of the load region, the larger is the time constant $\tau = L/R$ and the lower is the minimum frequency ("cut-off frequency") $f_0 = R/(2\pi L) = 1/(2\pi\tau)$ that can be measured by the measuring instrument. The resistance values near zero implemented in the measuring instrument expand the frequency range as compared to the measurements conducted with normally conducting flux transformers to the lower cut-off frequencies of $f_0 = 1$ Hz, or even below that. This measuring instrument can thus cover the entire frequency range from below 1 Hz to approximately 1 MHz, with the upper limit of the frequency range not being a physical limit, but defined solely by the availability of accordingly fast control electronics.

In a particularly advantageous embodiment of the invention, the transfer function of the flux transformer, which describes the conversion of the field, or field gradient, to be measured into the auxiliary field, is a high-pass filter. This advantageously has a cut-off frequency $f_0$ between 1 μHz and 1 kHz, and preferably between 3 mHz and 300 Hz. Compared to a direct measurement of the field to be measured, without using an auxiliary field, the flux transformer then has the effect that static or slowly variable interfering magnetic fields, or magnetic field gradients, in particular, do not contribute to the auxiliary field, and hence cannot be measured. This prevents a sensitive sensor from physically reaching the saturation limit as a result of the interference fields alone so that the measurement signal itself is not only a small modulation in a high base signal. By physically separating the interference fields before the sensor, the dynamics and sensitivity of the sensor can be fully utilized for the time-variable component of the magnetic field which is to be measured. This is particularly advantageous for biomagnetic and geomagnetic measurements as well as for non-destructive material testing and material research. In these measurements, signals from a wide frequency band also occur. For these measurements, another embodiment of the invention is thus particularly advantageous, in which the transfer function of the flux transformer, which describes the conversion of the field to be measured into the auxiliary field, is permeable to frequencies between the cut-off frequency $f_0$ of the high-pass filter and 1 MHz.

In a particularly advantageous embodiment of the invention, the sensor is a superconducting quantum interference device (SQUID). Given the sensitivity of SQUIDS of approximately 1 fT/Hz$^{1/2}$, combined with a variety of other properties, SQUIDs are still unsurpassed for many practical applications. They require cooling so as to maintain the superconducting state, however the technology required to do so is already present because according to the invention the flux transformer already contains superconducting components. The SQUID may comprise a superconducting loop, which is interrupted by at least one (rf SQUID) or two (dc SQUID) Josephson contacts. It may also comprise two superconducting loops, which are interrupted in total by three (3JJ SQUID) Josephson contacts. Aside from SQUIDs, it is also possible to employ other magnetic field sensors, such as GMR, CMR, Hall or fluxgate magnetic field sensors, to measure magnetic fields, or magnetic field gradients, that have been amplified by the flux transformer and filtered. These sensors are less sensitive than SQUIDs, but are particularly suitable for applications in which only the conductor loop and the magnetic field source are cooled, not however the sensor.

In a particularly advantageous embodiment of the invention, the magnetic field sensor is part of the sensor. For example, a superconducting coil having a winding that serves as the magnetic field source can be interrupted by one or more Josephson contacts. The coil, together with the Josephson contacts, then forms a SQUID, which measures the magnetic flux generated by the current that is fed from the conductor loop when the current passes through the same coil ("directly coupled SQUID"). Such an arrangement is possible because the current that is fed from the conductor loop and the signal generated at the Josephson contacts are superimposed without interference in the coil because of the superposition principle.

In a particularly advantageous embodiment of the invention, the conductor loop and the magnetic field source are interconnected so that a change in the field to be measured which is spatially homogeneous over the surface area that is enclosed by the conductor loop does not alter the current through the magnetic field source. The measuring instrument is then a gradiometer, which measures only the spatial gradient of the magnetic field at the site of the conductor loop.

In a particularly advantageous embodiment of the invention, the load region contains a material that has no phase transition to the superconducting state. Such a material remains normally conducting, or insulating, when the base material is cooled to below the transition temperature, and then forms the source of the electrical resistance. The load region may comprise a tunnel barrier for the tunnel contact between superconducting electrodes, for example. It then advantageously contains a very thin insulating material from the group consisting of $AlO_x$, MgO, AlN or MgO—NiO—MgO, when the base material and material of the superconducting electrodes is a low-temperature superconductor, such as Nb, NbN, $Nb_3Sn$, NbTa, NbTi, or $MgB_2$. For high-temperature superconductors having a transition temperature of more than 50 K as the base material, a compound according to formula $ZBa_2Cu_3O_7$, is notably suited, where Z is an element from the group consisting of (Y, Nd, Gd, Ho, Sm, Tm, Tb, Dy, Yb, Er or Eu). $YBa_2Cu_3O_{7-x}$, for example, has a transition temperature of approximately 93 K. The materials $PrBa_2Cu_3O_{7-x}$ or $SrTiO_3$ are particularly suited for tunnel barriers when $YBa_2Cu_3O_{7-x}$ is the base material and the material of the superconducting electrodes. The tunnel contacts are primarily thin film structures so as to produce the insulator layers in typical thicknesses of less than 100 nm, in a controlled manner.

The load region, however, may also contain normally conducting metals, such as silver, gold, platinum or the alloys thereof. The normally conducting resistance of these metals can then be taken advantage of, without necessitating the creation of a complicated tunnel contact. If the base material is a high-temperature superconductor, which contains a compound according to formula $ZBa_2Cu_3O_{7-x}$, particularly silver, gold, platinum or the alloys thereof can be coupled to electrodes made of this base material with particularly low contact resistance. If the base material is a low-temperature superconductor such as Nb, NbN, $Nb_3Sn$, NbTa, NbTi, or $MgB_2$, it is even easier to achieve negligible contact resistance with silver, gold, platinum or the alloys thereof. Moreover, with these base materials composed of low-temperature superconductors it is possible to produce a layered stack, in which the normally conducting metal (such as silver, gold, platinum or the alloys thereof) is placed between the lower and upper superconducting electrodes. In the case of low-temperature superconductors as the base material, it is even possible relatively easily to produce a low-ohm resistor based on normally conducting foils having low-temperature superconductor layers applied to both sides of this foil.

In a particularly advantageous embodiment of the invention, the load region has a coplanar structure that is composed of mutually spaced electrodes on a substrate, wherein these electrodes may contain, in particular, the base material of the conductor loop. The electrodes may be notably designed as thin films for this purpose. The electrodes may be designed as loops. The electrodes, which are superconducting below the transition temperature thereof, are connected by a normally conducting resistance layer. Structures of this type produce only low magnetic noise and can be manufactured in a variety of forms by means of optical lithography or electron beam lithography. The resistance of these structures is the sum of the resistance of the normally conducting layer between the superconducting electrodes and two contact resistances between the normally conducting layer and the superconducting electrodes. The contact resistances should be as low as possible so that, ideally, they can be neglected. The distance of the electrodes from each other should be small, so as to minimize the resistance of the normally conducting layer. However, it must be large enough so as to still prevent superconducting short-circuits. It is also desirable for a section, on which the electrodes are disposed at a distance opposite each other, to be implemented so as to be as long as possible. The longer this section between the electrodes is, the lower the resistance of the structure is. Particularly low resistance and relatively low magnetic noise are achieved in an advantageous embodiment of the invention in which the electrodes are meander-shaped. Even lower resistance is attained, in exchange for higher magnetic noise, when using an interdigitizing structure. In this structure, a respective "finger" of one electrode and a respective "finger" of the other electrode are always disposed next to and at a distance from each other.

If the base material of the conductor loop is, for example, a high-temperature superconductor that contains a compound according to formula $ZBa_2Cu_3O_{7-x}$, epitaxial layers made of the same material are best grown on substrates that are made of MgO or $SrTiO_3$. Both materials are insulators and do not influence the transport properties of the thin film structures. Given the low resistivity and a small contact resistance to $ZBa_2Cu_3O_{7-x}$ of silver, gold, platinum or the alloys thereof, the resistance layer is advantageously composed of these materials.

In an alternative advantageous embodiment of the invention, the load region comprises a layered stack that is composed of electrodes having a resistance layer disposed between the electrodes. The electrodes are superconducting below the transition temperature thereof. They are electrically connected by the resistance layer. This embodiment is particularly useful if the electrodes are made of the base material and this base material is a low-temperature superconductor, such as niobium. If the electrodes are made of a high-temperature superconductor, it is possible to implement such layered stacks in what is known as flip chip technology: Both superconducting electrodes can be epitaxially produced on two different substrates, structured by way of photolithography, and electrically connected to each other by a normally conducting layer that is disposed between the substrates. For this purpose, the normally conducting layer can, in particular, be formed by layers that are present on one of the substrates, or even on both substrates, prior to joining the substrates.

The magnetic field source and the load region can be structured ("integrated") as thin films on the same substrate or, as an alternative, they can be structured on separate substrates that are joined by the structured surfaces thereof ("flip-chip" technology). The conductor loop and the magnetic field source can also be structured ("integrated") as thin films on the same substrate or, as an alternative, they can be structured on separate substrates that are joined by the structured surfaces thereof ("flip-chip" technology). The sensor and the magnetic field source can be structured ("integrated") on the same substrate or, as an alternative, they can be structured on separate substrates that are joined by the structured surfaces thereof ("flip-chip" technology). The integration of the magnetic field source and sensor can even go as far as making the magnetic field source a part of the sensor. In the preferred embodiment in which the sensor is a SQUID, notably the conductor loop of the SQUID, which is interrupted by one or more Josephson contacts, can also be used as the magnetic field source that applies the auxiliary magnetic field to the surface area delimited by the conductor loop. This principle is best suited when the base material is a high-temperature superconductor. If, in contrast, the base material is a low-temperature superconductor, better results are achieved when the magnetic field source is electrically insulated from the SQUID and thus is coupled to the SQUID only inductively.

All these embodiments have the advantage that they can be produced using the photolithographic structuring techniques common in mass production.

In a further advantageous embodiment of the invention, the sensor and the magnetic field source are located inside a magnetic shield. The conductor loop can then remain outside of the shield. If it is exposed to a slowly variable external interference field, or if it is moved by such a field, the electric energy it introduces is dissipated by the load region.

The measuring instrument according to the invention takes advantage of a tailored resistance value of the load region that is close to zero. As described above, such low-noise resistors can be used not only for flux transformers and sensors, but also for several other structures in superconducting electronics, such as RSFQ or quantum computers. The invention thus, in general, also refers to an electrical resistance element having a resistance value that is other than zero and is $10^{-4}\Omega$ or less, and preferably $10^{-6}\Omega$ or less. This resistance element can have two particularly advantageous designs:

- a coplanar structure composed of mutually spaced electrodes, which are electrically connected by a normally conducting resistance layer, and can be disposed in particular on a substrate, wherein the electrodes can notably be meander-shaped and/or designed so as to interdigitize the structure, and/or
- a layered stack composed of electrodes, between which a normally conducting resistance layer is disposed.

To this end, the respective material of the electrodes has a phase transition to the superconducting state. The electrodes can notably be structured by means of photolithography.

The normally conducting resistance layer can notably comprise a normally conducting metal, and particularly preferably gold, silver, platinum or an alloy containing these elements. The layered stack may also comprise a thin foil made of a normally conducting metal, which is coated on both sides with a material that has a phase transition to the superconducting state.

Proceeding from these design approaches and the additional conditions for the location in the superconducting circuit at which the resistance element is to be used, a person skilled in the art can implement a specific embodiment having a predefined resistance value using the routine methods of classic electrodynamics.

Because the resistance element can be used as a key component in the measuring instrument according to the invention, which in turn constitutes the first implementation of a device for carrying out the method according to the invention, which is described hereafter, the disclosure with respect to the resistance element which exists in connection with the measuring instrument also expressly refers to the resistance element per se.

The invention also relates to a measuring system for biomagnetic measurements, for geomagnetic measurements, for non-destructive material testing and/or material research, containing a measuring instrument according to the invention or an electrical resistance element according to the invention. These applications benefit from the respective advantages according to the invention, notably the sensitivity, the spectral band width and the dynamic range of the measuring system.

The subject matter of the invention will be described in more detail hereafter based on figures, without thereby limiting the subject matter of the invention.

DESCRIPTION OF THE PREFERRED EMBODIMENTS

Figure 1:
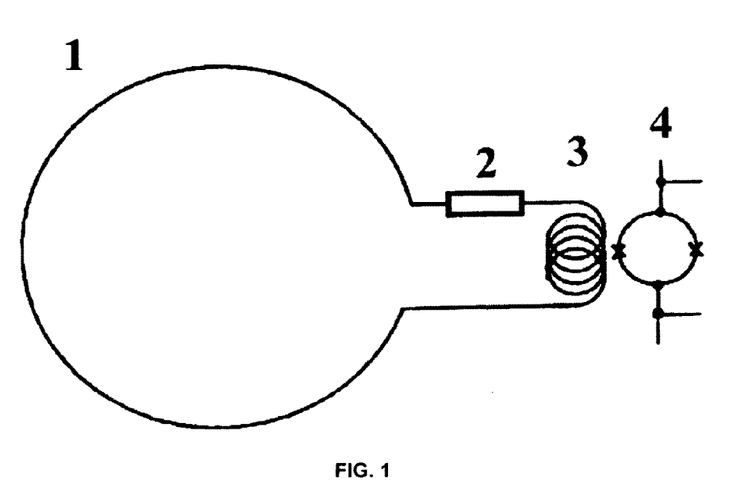
FIG. 1 is an exemplary embodiment of the measuring instrument according to the invention.

FIG. 1 shows a sketch of an exemplary embodiment of the measuring instrument according to the invention. The flux transformer is a circuit, which is composed of a series connection comprising a superconducting conductor loop as the pick-up coil 1, a low-ohm resistor 2 as the load region, and a superconducting coil 3 as the input coupling coil. In this embodiment, any change in the magnetic flux through the pick-up coil 1 causes a current through the coil 3 and thus makes a contribution to the auxiliary magnetic field generated by the coil 3. The auxiliary field is measured by a superconducting quantum interference device (SQUID) 4.

Figure 2A:
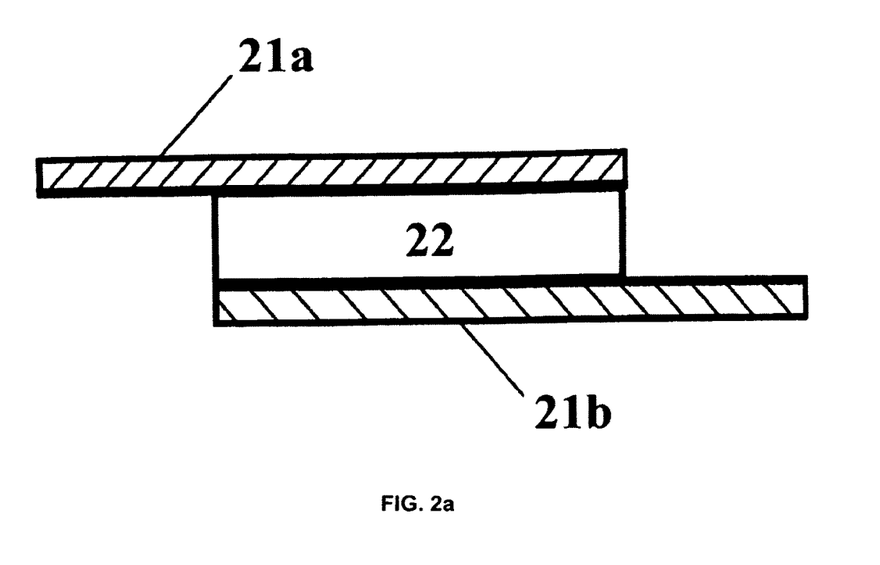
FIGS. 2a, 2b and 2c are possible embodiments of a resistance element ("load region") according to the invention: a layered stack comprising a resistance layer or tunnel barrier as the central layer (FIG. 2a), a coplanar structure of two meander-shaped electrodes (FIG. 2b), and an interdigitizing structure of two electrodes (FIG. 2c).
Figure 2B:
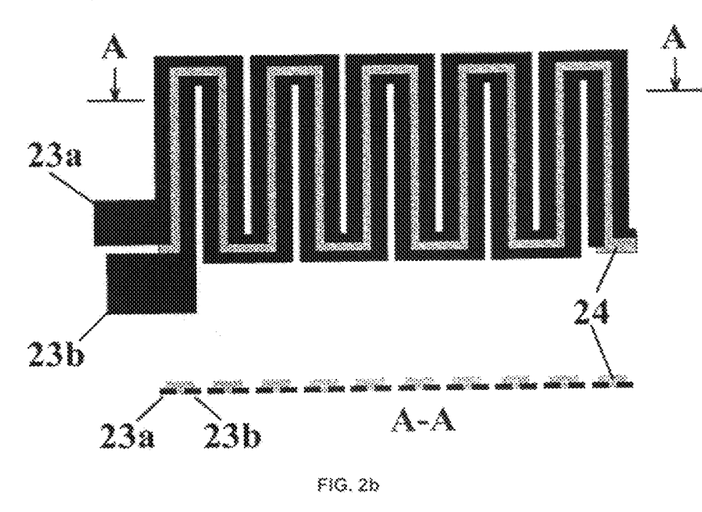
Figure 2C:
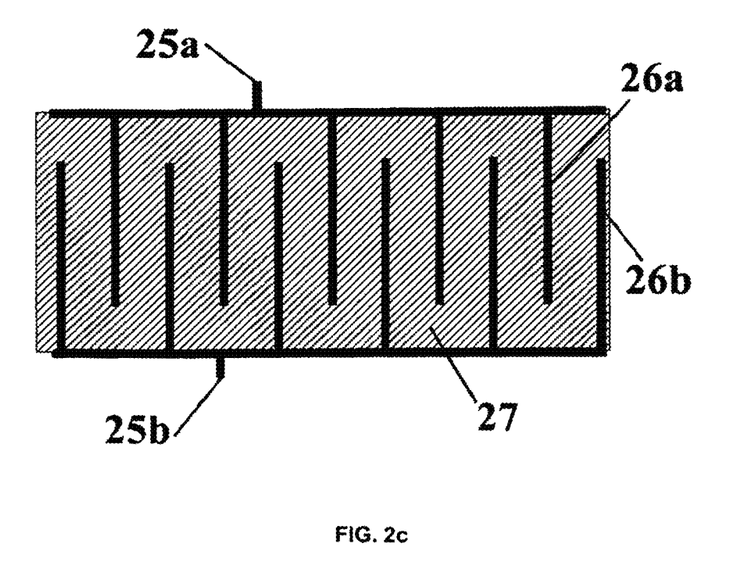

FIG. 2 shows three possible embodiments of the electrical resistance element according to the invention, which can be used as a load region 2.

FIG. 2a shows a cross-section of an exemplary embodiment of a layered stack that is composed of electrodes 21a and 21b having a resistance layer 22 disposed between the electrodes. The electrodes 21a and 21a are made of a low-temperature superconducting base material (Nb, NbN, $Nb_3Sn$, NbTa, NbTi, or $MgB_2$) or a high-temperature superconducting base material (for example, a superconducting material according to formula $ZBa_2Cu_3O_{7-x}$, where Z can notably be yttrium). An insulator (only in the case of tunnel barriers), or a normally conducting material, can serve as the resistance layer 22.

FIG. 2b shows an exemplary embodiment of a coplanar structure of superconducting electrodes 23a and 23b in a top view of a schematic drawing, which is not true to scale. The electrodes are made of a low-temperature superconducting base material (Nb, NbN, $Nb_3Sn$, NbTa, NbTi, or $MgB_2$) or a high-temperature superconducting base material (for example, a superconducting material according to formula $ZBa_2Cu_3O_{7-x}$, where Z can notably be yttrium) and are applied to an insulating substrate, which is made of MgO or $SrTiO_3$ and which is not shown in FIG. 2b. The electrode 23a and the electrode 23b are disposed adjacent to each other at a distance of 50 μm, for example. The electrodes 23a and 23b are thus disposed adjacent to, and at a distance from, each other and are electrically connected to each other by a normally conducting material 24. The meander-shaped path along the normally conducting material 24 has a considerable length. This path is significantly longer than the edge length of the entire structure, which is approximately 1 cm. The normally conducting material 24 can, for example, be applied to the electrodes 23a and 23b as a laterally structured resistance layer, as is illustrated in the sectional drawing in the lower part of FIG. 2b.

The total resistance of the resistance element thus designed results from $$R = \rho \cdot \frac{l}{d \cdot w}.$$

Herein, ρ is the resistivity of the material (such as silver), of which the normally conducting resistance layer is made, and d is the thickness of the resistance layer (typically approximately 1 μm). l is the distance between the two superconducting electrodes 23a and 23b (typically 50 μm), and w is the effective width (approximately 100 cm) of the normally conducting resistance layer 24 ("load region"), measured along the meander-shaped normally conducting connection between the superconducting electrodes 23a and 23b. The silver material of the resistance layer has a resistivity ρ of approximately 1 μΩ at low temperatures, so that a total resistance R of $5 \times 10^{-7}$ Ω results for the arrangement shown in FIG. 2b, provided the electrodes 23a and 23b are in the superconducting state.

FIG. 2c shows an exemplary embodiment of a interdigitizing structure of superconducting electrodes 25a and 25b in a top-view schematic drawing that is not true to scale. The electrodes are made of a low-temperature superconducting base material (Nb, NbN, $Nb_3Sn$, NbTa, NbTi, or $MgB_2$) or a high-temperature superconducting base material (for example, a material according to formula $ZBa_2Cu_3O_{7-x}$, where Z can notably be yttrium) and are applied to an insulating substrate that is made of MgO or $SrTiO_3$, which is not shown in FIG. 2c. A "finger" 26a of electrode 25a and a "finger" 26b of electrode 25b are, in each case, disposed adjacent to each other at a distance of 50 μm, for example. The electrodes 25a and 25b are thus disposed adjacent to and at a distance from each other and are electrically connected to each other by a normally conducting material 27. The meander-shaped path in the intermediate space of the two finger electrodes 26a and 26b has a considerable length. This path is significantly longer than the typical edge length of the entire structure, which is approximately 1 cm. Along this path, the electrical connection between the electrodes 25a and 25b, which is subject to resistance, is conveyed through a resistance layer that is applied to the interdigitizing structure. It is to be expected that, with an identical edge length for the structure, the resistance of the arrangement according to FIG. 2c is less, yet the noise is significantly greater than in the structure according to FIG. 2b.

Figure 3A:
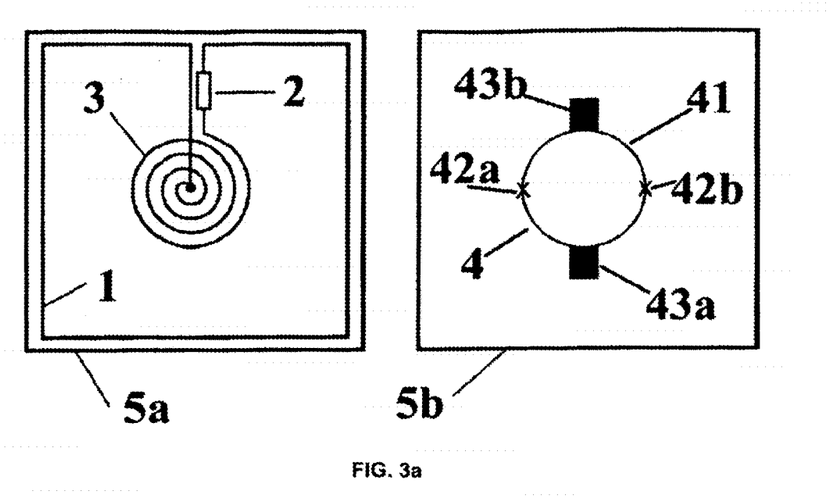
FIGS. 3a and 3b are other exemplary embodiments of the measuring instrument according to the invention, which can be produced in "flip-chip" technology (FIG. 3a), and a directly coupled SQUID serving as the sensor and a magnetic field source in a component (FIG. 3b).

FIG. 3a shows another exemplary embodiment of the measuring instrument according to the invention in a top view of a schematic drawing that is not true to scale. The superconducting pick-up coil 1 is structured on a first substrate 5a, with this coil supplying the superconducting coil, which here has a helical design, and the input coupling coil 3, which is structured on the same substrate 5a, via a low-ohm resistor 2. This input coupling coil 3 is disposed inside the region that is enclosed by the pick-up coil 1. The sensor 4 is designed here as a SQUID and comprises a superconductor 41, which is interrupted by two Josephson contacts 42a and 42b and is contacted by two metallic contacts 43a and 43b with the evaluation unit, which is not shown in FIG. 3. The sensor 4 is structured on a second substrate 5b. The two substrates 5a and 5b are combined to form the measuring instrument according to the invention by joining the structured surfaces thereof. For this purpose, the substrate 5a can be folded over the substrate 5b, for example ("flip-chip" technology). The coil 3 is then located inside the superconductor 41, so that the auxiliary magnetic field generated by the coil can be registered by the SQUID 4.

Figure 3B:
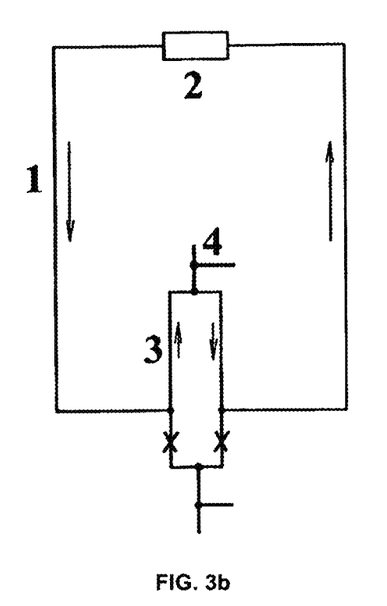

FIG. 3b shows an exemplary embodiment of the measuring instrument according to the invention, in which the magnetic field source 3 is part of the sensor 4, which here is designed as a SQUID. The magnetic field source 3, which here is the input coupling coil, is also the coil comprising a winding that is interrupted by two Josephson contacts and thus forms the SQUID 4. The current that is fed from the pick-up coil 1 to the input coupling coil 3 flows along the boundary of the region in which the SQUID is sensitive, yet without flowing through the Josephson contacts (illustrated by the arrows in FIG. 3b). The current thus generates the auxiliary magnetic field directly in the SQUID, without interfering with the measurement of this auxiliary field.

FIG. 4 shows four exemplary embodiments of an interconnection of the input coupling coil 3 and the superconducting pick-up coil 1, in which a change in the flux to be measured which is homogeneous over the pick-up coil 1 leaves the current through the superconducting input coupling coil 3 unaltered. All subimages a to d are respective top views of schematic drawings that are not true to scale.

Figure 4A:
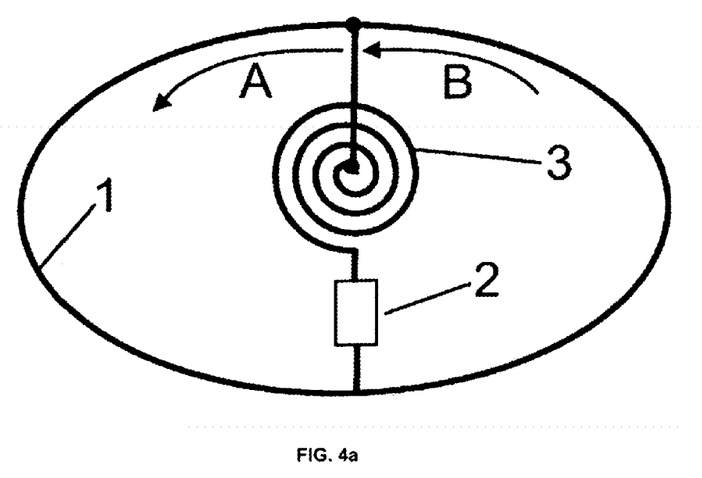
FIGS. 4a, 4b, 4c and 4d show exemplary embodiments of an interconnection of a pick-up coil and input coupling coil, each acting as a radiometer: a structure comprising an input coupling coil as the connection in the center (FIG. 4a and FIG. 4b) and two intersecting partial loops (FIG. 4c), or three intersecting partial loops (FIG. 4d).
Figure 4B:
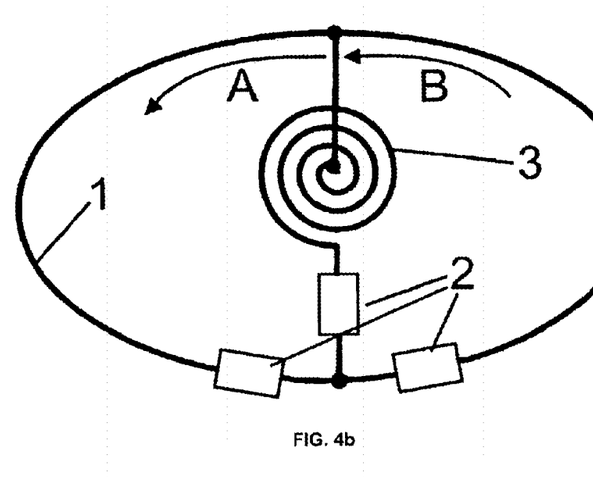

In FIG. 4a, the pick-up coil 1 has an elliptical design. A series connection composed of the helical coil 3 and a low-ohm resistor 2 is disposed on the semi-minor axis thereof. A change in the field to be measured which is spatially homogeneous over the pick-up coil 1 causes two opposing currents A and B, which are identical in terms of the absolute values, to be induced in the pick-up coil 1, with these currents cancelling each other out and thus not contributing to the current through the input coil 3. In FIG. 4b, two further resistors ("load regions") are additionally integrated in the pick-up coil, which are used for high-pass filtering and dissipating the currents A and B in the pick-up coil.

Figure 4C:
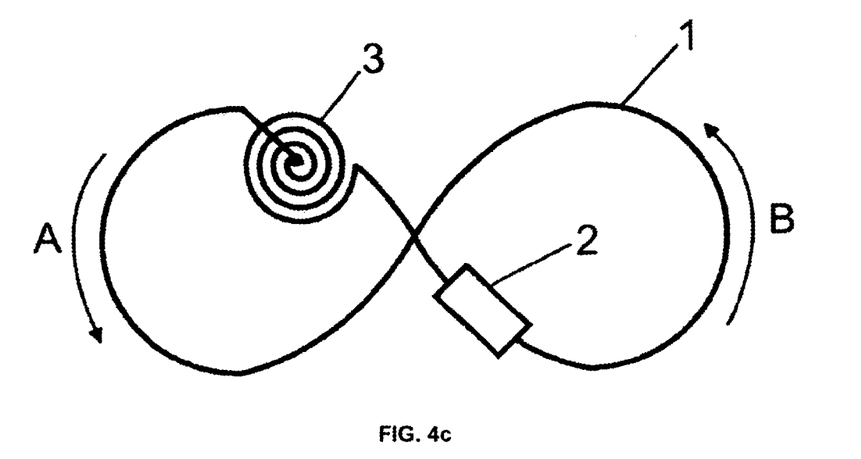

The same principle is also implemented in FIG. 4c, where the pick-up coil 1 is composed of two intersecting partial loops having the same surface areas and has the shape of the mathematical infinity sign.

The arrangements shown in FIGS. 4a to 4c are first-order gradiometers. A change in the field to be measured which is spatially homogeneous over the pick-up coil 1 does not result in any current through the input coupling coil 3. Only a change in the flux to be measured which is spatially inhomogeneous over the pick-up coil 1 results in currents A and B that have different absolute values, and thus in a differential current through the input coupling coil 3, which generates an auxiliary magnetic field. This auxiliary field cannot be registered by the sensor shown in FIG. 4.

Figure 4D:
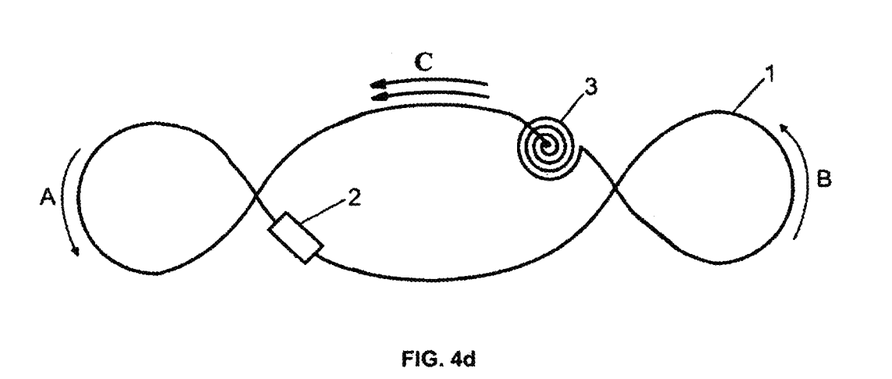

FIG. 4d shows a second-order gradiometer. It comprises three partial loops, in which a time-variable magnetic field, or a time-variable magnetic field gradient, induces a respective current A, B or C. The center partial loop has the same surface area as the two other partial loops combined. The three partial loops intersect in two points. With both a spatially homogeneous change in the field to be measured and a change in the shape of a first-order gradient, the three currents A, B and C offset each other, so that no current flows through the input coupling coil 3. Only with a second-order gradient do the currents not offset each other. A current then flows through the input coupling coil 3, which generates an auxiliary field that can be detected by the sensor.

The same principle can be applied to higher-order gradiometers.

All four arrangements have in common that the input coupling coil 3 is disposed at least partially inside the region that is enclosed by the pick-up coil 1. Here, the ideal case is implemented, in which no additional feed lines are required for the input coupling coil 3, aside from the pick-up coil 1.

The invention claimed is:

1. A measuring instrument for time-variable magnetic fields, or field gradients, comprising:
a flux transformer having a conductor loop comprising a base material, which has a phase transition to the superconducting state, for converting a time-variable magnetic flux, or flux gradient, into an electric current, and a magnetic field source that is fed by said conductor loop for converting the electric current into an auxiliary magnetic field; and
a sensor for the auxiliary magnetic field, wherein the flux transformer, even when the base material is in the superconducting state, comprises at least one resistive region for dissipating the electric energy in the circuit, which comprises the conductor loop and the magnetic field source, the conductor loop and the magnetic field source being disposed in one plane, and at least one electrical resistance element which has an electric resistance between $10^{-11}\Omega$ and $10^{-5}\Omega$ or at least one tunnel contact at the resistive region.

2. A measuring instrument according to claim 1, wherein the conductor loop and/or the magnetic field source are coils that each have at least one winding.

3. The measuring instrument according to claim 2, wherein the conductor loop has a diameter of 1 cm or more.

4. The measuring instrument according to claim 3, wherein the conductor loop has a diameter of 3 cm or more.

5. The measuring instrument according to claim 4, wherein the conductor loop has a diameter of 5 cm or more.

6. A measuring instrument according to claim 2, wherein the magnetic field source has between 80% and 120% of the inductance of the conductor loop.

7. The measuring instrument according to claim 6, wherein the conductor loop and magnetic field source have identical inductances.

8. A measuring instrument according to claim 2, wherein the magnetic field source has a diameter of 3 mm or less.

9. A measuring instrument according to claim 2, wherein the ratio of the diameters of the magnetic field source and conductor loop is no more than 0.1.

10. A measuring instrument according to claim 2, wherein the ratio of the numbers of windings between the magnetic field source and conductor loop is at least as high as the square root of the ratio of the diameters of the magnetic field source and conductor loop.

11. The measuring instrument according to claim 2, wherein the conductor loop is a pick-up coil.

12. The measuring instrument according to claim 2, wherein the magnetic field source is an input coupling coil.

13. A measuring instrument according to claim 1, wherein the electrical resistance element comprises a coplanar structure composed of mutually spaced electrodes, which are electrically connected by a resistance layer made of a normally conducting material, the material of the electrodes having a phase transition to the superconducting state.

14. A measuring instrument according to claim 13, wherein the resistive region has an electrical resistance between $10^{-11}\Omega$ and $10^{-6}\Omega$.

15. A measuring instrument according to claim 13, wherein the structure of the electrical resistance element has an interdigitizing design.

16. The measuring instrument according to claim 13, wherein the resistive region is a load region.

17. A measuring instrument according to claim 1, wherein the inductance of the flux transformer ranges between 1 nH and 1 mH.

18. The measuring instrument according to claim 17, wherein the inductance of the flux transformer ranges between 10 nH and 100 µH.

19. A measuring instrument according to claim 1, wherein an electric current circulating in the flux transformer has a relaxation time τ between 1 ms and $10^6$ s at least when the base material is in the superconducting state.

20. A measuring instrument according to claim 19, wherein an electric current circulating in the flux transformer has a relaxation time τ between 3 ms and 300 s, at least when the base material is in the superconducting state.

21. A measuring instrument according to claim 1, wherein the transfer function of the flux transformer, which describes the conversion of the field, or field gradient, to be measured into the auxiliary field, is a high-pass filter.

22. The measuring instrument according to claim 21, wherein the high-pass filter has a cut-off frequency $f_0$ of between 1 µHz and 1 kHz.

23. The measuring instrument according to claim 22, wherein the high-pass filter has a cut-off frequency $f_0$ of between 3 mHz and 300 Hz.

24. The measuring instrument according to claim 1, wherein the conductor loop and/or the magnetic field source are designed as thin layers having a layer thickness of 1 µm or less.

25. A measuring instrument according to claim 1, wherein the material of the magnetic field source has a phase transition to the superconducting state.

26. A measuring instrument according to claim 1, wherein the magnetic field source is disposed at least partially inside the region that is enclosed by the conductor loop.

27. A measuring instrument according to claim 1, wherein the transfer function of the flux transformer, which describes the conversion of the flux to be measured into the auxiliary field, is permeable to frequencies between the cut-off frequency $f_0$ of the high-pass filter and 1 MHz.

28. A measuring instrument according to claim 1, wherein the sensor is a superconducting quantum interference device (SQUID).

29. A measuring instrument according to claim 1, wherein the magnetic field source is part of the sensor.

30. A measuring instrument according to claim 1, wherein the conductor loop and the magnetic field source are interconnected so that a change in the field to be measured which is spatially homogeneous over the surface area that is enclosed by the conductor loop does not alter the current through the magnetic field source.

31. A measuring instrument according to claim 1, wherein the base material comprises Nb, $Nb_3Sn$, NbTa, NbTi, NbN or $MgB_2$.

32. A measuring instrument according to claim 1, wherein the base material contains a compound according to formula $ZBa_2Cu_3O_{7-x}$, where Z is an element from the group consisting of (Y, Nd, Gd, Ho, Tm, Tb, Dy, Yb, Sm, Er or Eu).

33. The measuring instrument according to claim 1, wherein the tunnel contact is an insulator material from the group consisting of $AlO_x$, MgO, AlN, MgO—NiO—MgO, $PrBa_2Cu_3O_{7-x}$, or $SrTiO_3$.

34. A measuring instrument according to claim 1, wherein the resistive region comprises a normally conducting metal from the group consisting of Ag, Au, Pt or the alloys thereof.

35. A measuring instrument according to claim 1, wherein the magnetic field source and the load region are structured as thin films on the same substrate or, as an alternative, are structured on separate substrates that are joined at the structured surfaces thereof.

36. A measuring instrument according to claim 1, wherein the conductor loop and the magnetic field source are structured as thin films on the same substrate or, as an alternative, are structured on separate substrates that are joined at the structured surfaces thereof.

37. A measuring instrument according to claim 1, wherein the sensor and the magnetic field source are structured on the same substrate or, as an alternative, are structured on separate substrates that are joined at the structured surfaces thereof.

38. A measuring instrument according to claim 1, wherein the sensor and the magnetic field source are located inside a magnetic shield.

39. A measuring instrument according to claim 1, wherein the electrical resistance element comprises electrodes which are meander-shaped.

* * * * *